United States Patent
Sunaga

(10) Patent No.: US 7,859,935 B2
(45) Date of Patent: Dec. 28, 2010

(54) MEMORY SYSTEM WITH LOW CURRENT CONSUMPTION AND METHOD FOR THE SAME

(75) Inventor: Toshio Sunaga, Ohtsu (JP)

(73) Assignee: International Business Machines Corporation, Armonk, NY (US)

(*) Notice: Subject to any disclaimer, the term of this patent is extended or adjusted under 35 U.S.C. 154(b) by 223 days.

(21) Appl. No.: 12/159,062

(22) PCT Filed: Dec. 25, 2006

(86) PCT No.: PCT/JP2006/325820

§ 371 (c)(1),
(2), (4) Date: Jul. 2, 2008

(87) PCT Pub. No.: WO2007/077801

PCT Pub. Date: Jul. 12, 2007

(65) Prior Publication Data

US 2009/0231941 A1    Sep. 17, 2009

(30) Foreign Application Priority Data

Dec. 28, 2005    (JP)    ............................. 2005-378090

(51) Int. Cl.
*G11C 5/14* (2006.01)
(52) U.S. Cl. .................. 365/226; 365/230.06; 327/530
(58) Field of Classification Search ............ 365/230.06, 365/227
See application file for complete search history.

(56) References Cited

U.S. PATENT DOCUMENTS

| | | | | |
|---|---|---|---|---|
| 5,587,960 A | * | 12/1996 | Ferris | ..................... 365/230.03 |
| 5,875,133 A | | 2/1999 | Miyashita et al. | |
| 6,075,746 A | * | 6/2000 | Ohsawa | .................. 365/230.06 |
| 2003/0137889 A1 | * | 7/2003 | Lee | ............................. 365/204 |

FOREIGN PATENT DOCUMENTS

JP    08-001177    1/1996

OTHER PUBLICATIONS

Seong-Ik Cho et al., "Two-Phase Boosted Voltage Generator for Low-Voltage DRAMs," IEEE Journal of Solid State Circuits, pp. 1726-1729, vol. 38, No. 10, Oct. 2003.
Yoshinobu Nakagome et et al., "An Experimental 1.5-V 64-Mb DRAM," IEEE Journal of Solid State Circuits, pp. 465-472, vol. 26, No. 4, Apr. 1991.

* cited by examiner

*Primary Examiner*—Hoai V Ho
*Assistant Examiner*—James G Norman
(74) *Attorney, Agent, or Firm*—James R. Nock

(57) ABSTRACT

A memory system includes: a high-voltage-supply booster circuit for driving an access control circuit from a low voltage for memory access to a high voltage for memory access by supplying electric charge that is stored in advance to an access control circuit in response to an access start request for a memory cell array; and a low-voltage-supply booster circuit for absorbing excess electric charge when the access control circuit is switched from the high voltage to the low voltage in response to an access end request for the memory cell array.

9 Claims, 8 Drawing Sheets

MEMORY SYSTEM WITH LOW CURRENT CONSUMPTION AND METHOD FOR THE SAME

TECHNICAL FIELD

The present invention relates generally to memory systems and, more specifically, it relates to a circuit and a method for generating a high-level voltage and a low-level voltage with high efficiency to reduce current consumption of a memory system in operation.

BACKGROUND ART

Known dynamic random access memories (DRAMs) that use a common N-channel metal oxide semiconductor (N-channel MOS) field effect transistor (FET) as a cell transistor of the memory cell have the problem of high current consumption of a word line circuit that drives word lines connected to the gates of the cell transistors of the memory cells.

Specifically, high-level values are written to the memory cells of such memories by applying a high-level voltage to bit lines (data lines) connected to the sources of the memory cells. Therefore, the high-level voltage (high voltage Vpp) of the word lines connected to the gates of the memory cells must be higher than the high-level voltage of the bit lines by at least the threshold voltage Vt of the cell transistors. Furthermore, in a state in which data is stored in the memory cells with the voltage of the word lines held at a low level, the threshold voltage Vt must be significantly high to keep the leak current between the drain and the source of each cell transistor below the order of f (femto: $1 \times 10^{15}$) A (ampere). Furthermore, when the bit lines are at a high level, the voltage of the word lines (the gate voltage of the cell transistors) sufficient to write the full high-level value of the bit lines to the memory cells at high speed is considerably as high as 3.0 V or more, because this is a source follower (grounded drain) operation in a state in which the substrate is biased at the voltage Vt. The high-level voltage Vpp of the word lines has recently been decreased to about 2.6 V to 2.8 V because of the necessity for decreasing the word line voltage as DRAMs become finer. Therefore, the threshold voltage Vt of cell transistors must also be decreased. However, the decrease in threshold voltage Vt increases the leak current of memory cells. To prevent it, negative voltages from −0.2 V to −0.5 V are used as the low-level voltage (low voltage Vnn) of word lines. These high-level voltages from 2.6 V to 2.8 V of word lines and negative low-level voltages from −0.2 V to −0.5 V of word lines are generated from the internal voltage of DRAMs by the charge pump circuits in DRAM chips (referred to as a Vpp pump and a Vnn pump, respectively). Since such negative voltages are used as the low-level voltage of word lines, the high-level voltage is decreased to 2.6 V to 2.8 V. However, the internal voltage for generating it is also decreased to about 1.6 V, so that their voltage ratio remains large, and the current consumption is also high because of conversion loss due to the low efficiency of the charge pump circuits, to be described below.

According to S. I. Cho, "IEEE Journal of Solid State Circuits", pp. 1726-1729, vol. 38, no. 10, October 2003, general charge pump circuits are inefficient; particularly, the efficiency of Vpp pumps for generating a high voltage is as low as about 40%. Furthermore, according to Y. Nakagome, "IEEE Journal of Solid State Circuits", pp. 465-472, vol. 26, no. 4, April 1991, the low efficiency of charge pump circuits is caused by large current flowing through control and driving circuits because a single kind of transistors are used to prevent reverse bias of the junctions. In other words, the Vpp pump is formed of N-channel MOS FETs. Accordingly, in order to control a high voltage, a higher voltage must be applied. To generate this voltage, a pump using a capacitor is needed; for example, to generate the high-level voltage Vpp twice as high as a supply voltage, the maximum three times the supply voltage must be generated by the control circuit, which causes high current consumption.

A current of a value calculated by multiplying the current actually used in the circuit (word line circuit) of the memory by the reciprocal of efficiency expressed in percentages flows from the power supply. Accordingly, with an efficiency of 40%, a current 2.5 times as high as current used in an actual word line circuit is consumed in its memory chip. A recent increase in memory capacity of DRAMs has increased word lines that must be activated at once. In addition, particularly in synchronous dynamic random access memories (SDRAMs), all the banks are refreshed at the same time. This needs to activate word lines of a bank-number multiple (normally, four banks) of that of normal access, resulting in current consumption as high as 20 mA for 512-Mbit SDRAMs. This has become a significant obstacle to reduction in normal access current or refresh current.

On the other hand, a known example of a method not using such a charge pump circuit for generating a voltage Vpp higher than the internal voltage is one using a booster circuit. The booster circuit is a circuit for boosting voltage using a capacitor and a switch using an N-channel MOS FET, which has a well-known structure used when DRAMs are not made of complementary metal oxide semiconductor (CMOS) currently used but are made of only N-type MOS (until the middle of 1980s when DRAMs earlier than 1-Mbit DRAMs are used).

Japanese Unexamined Patent Application Publication No. 6-139776 discloses an idea about enhancing the speed of this booster circuit. That is to say, there are various additional parasitic capacitors around a row address decoder. The booster circuit must boost the nodes connected to those capacitors. Accordingly, if the capacitors have large capacitance, it takes much time to boost them, precluding high-speed operation. To solve this problem, the voltage to be applied to those nodes is raised to a predetermined level in advance through another route via a switch, and then the predetermined-level voltage is raised to a word-line voltage level higher than that using the booster circuit, without relying on the booster circuit for all the boosting, thereby reducing the total time to boost the voltage to the nodes.

However, this method only achieves high-speed boosting of the voltage but does not achieve reduction of current consumption. Furthermore, recent general memory systems supply high DC voltage generated from supply voltage to word lines using a charge pump circuit, as described above. With such a structure, there is considered no method for achieving high speed and low current consumption in supplying a high voltage.

SUMMARY OF INVENTION

The present invention provides a memory system for memories such as DRAMs having a voltage generating circuit, including a charge pump circuit, for generating a high-level and a low-level voltage to be supplied to word lines that drive the gates of memory cells. The memory system is configured to reduce large current consumption in active and standby modes caused by low efficiency inherent to the voltage generating circuit by improving the efficiency of the voltage generating circuit and to speed up voltage supply. The present invention further provides a method for achieving the low current consumption.

According to a second aspect of the invention, there is provided a method for a memory system to supply a voltage to an access control circuit using a voltage-supply booster circuit so as to drive the access control circuit with a high voltage for memory access and a low voltage for memory access, the access control circuit receiving either of an access start request or an access end request for a memory cell array and controls access to the memory cell array. The method includes: a first charging step of charging the voltage-supply booster circuit in response to the access start request; a first discharging step of discharging, after completion of the charging, the stored electric charge to the access control circuit; and a first initializing step of initializing the voltage level for the next charging while holding the residual electric charge after the discharging in the voltage-supply booster circuit. The method further includes: a second charging step of charging the voltage-supply booster circuit from the access control circuit in response to the access end request; a second discharging step of discharging, after completion of the charging, the stored electric charge; and a second initializing step of initializing the voltage level for the next charging while holding the residual electric charge after the discharging in the voltage-supply booster circuit.

According to a third aspect of the invention, there are provided an apparatus for supplying voltage to a target system that requires its internal circuit to be driven by at least a binary voltage of a high voltage and a low voltage. The apparatus includes: a high-voltage-supply boost circuit for driving the internal circuit in the target system from the low voltage to the high voltage by supplying electric charge that is stored in advance to the target system in response to a request for the target system for starting driving by the high voltage; and a low-voltage-supply booster circuit for absorbing excess electric charge when the internal circuit of the target system is switched from the high voltage to the low voltage in response to a request for the target system for ending the driving by the high voltage, and a method for supplying voltage having steps corresponding thereto.

It is needless to say that the outline of the invention described above does not include all the necessary characteristics of the invention but combinations of parts of the characteristics can also be the invention.

ADVANTAGES

The invention can reduce current consumption of memory systems of DRAMs and other memories in active and standby modes.

DETAILED DESCRIPTION OF THE INVENTION

The best modes (hereinafter, referred to as embodiments) for carrying out the invention will be described in detail with reference to the accompanying drawings. Those embodiments do not limit the invention according to the claims and all the combinations of the characteristics described in the embodiments are not absolutely necessary as the solving means of the invention.

Figure 1:
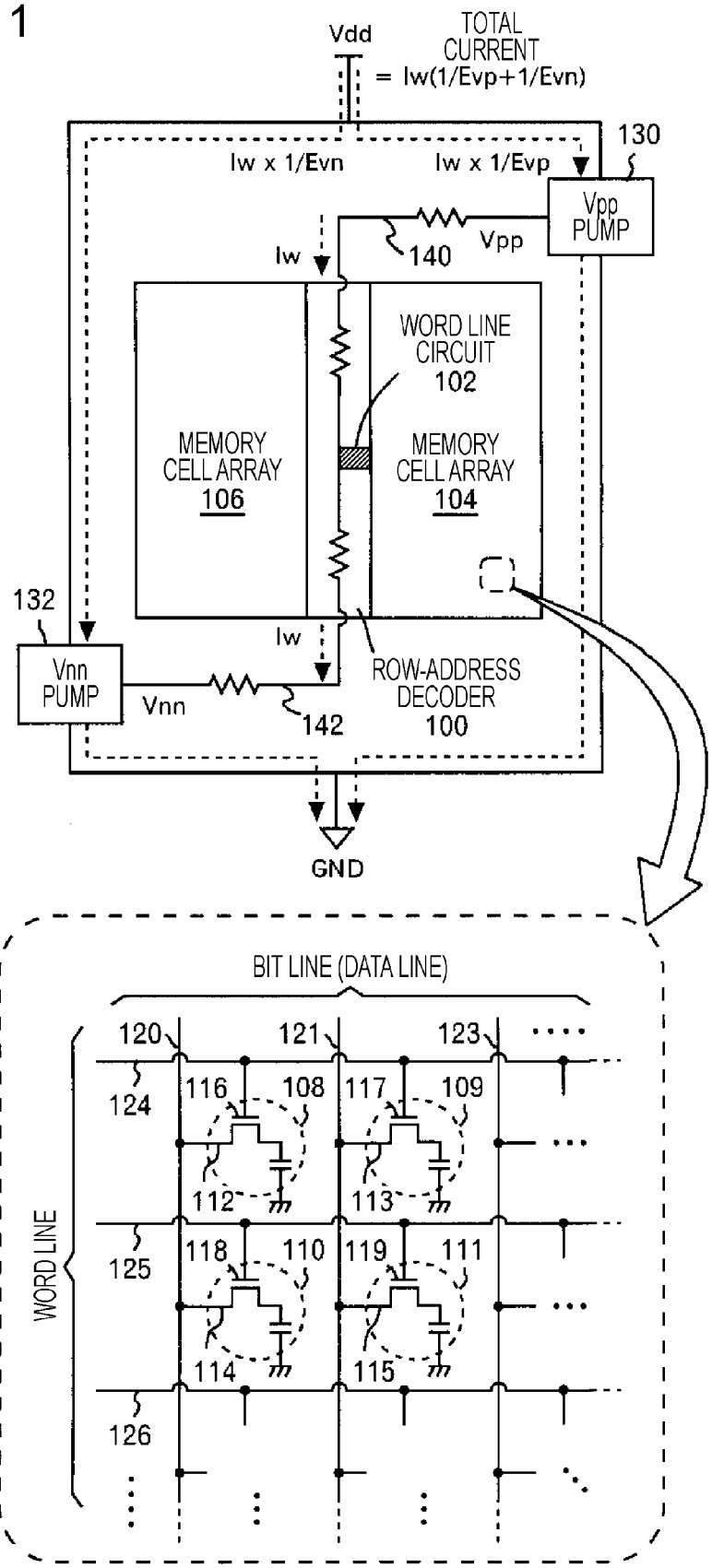
FIG. 1 is a schematic diagram of a related-art DRAM chip.

Before the description of the embodiments of the invention, the details of the structure and operation of related-art memories such as DRAMs will be described. FIG. 1 shows the structure of a related-art DRAM chip. The DRAM chip has a row address decoder (RDEC) 100 in the center and memory cell arrays 104 and 106 on both sides thereof. The memory cell arrays 104 and 106 each have memory cells 108 to 111 and so on, each of which is a memory unit of the DRAMs, arrayed vertically and horizontally. For the memory cells 108, 110 and so on arrayed in the vertical direction, one bit line (also referred to as a data line) 120 is connected to the sources 112, 114 and so on of the FETs that constitute the memory cells. For the memory cells 108, 109 and so on arrayed in the horizontal direction, one word line 124 is connected to the gates 116, 117 and so on of the FETs that constitute the memory cells. The bit lines and the word lines are driven to a high level or a low level at appropriate timing so that a high or low value is stored in a desired memory cell in the memory cell arrays 104 and 106, or the value stored in the desired memory cell can be read. The row address decoder 100 is a block that decodes (not shown) row addresses input thereto and generates word lines to the memory cell arrays 104 and 106.

Figure 2:
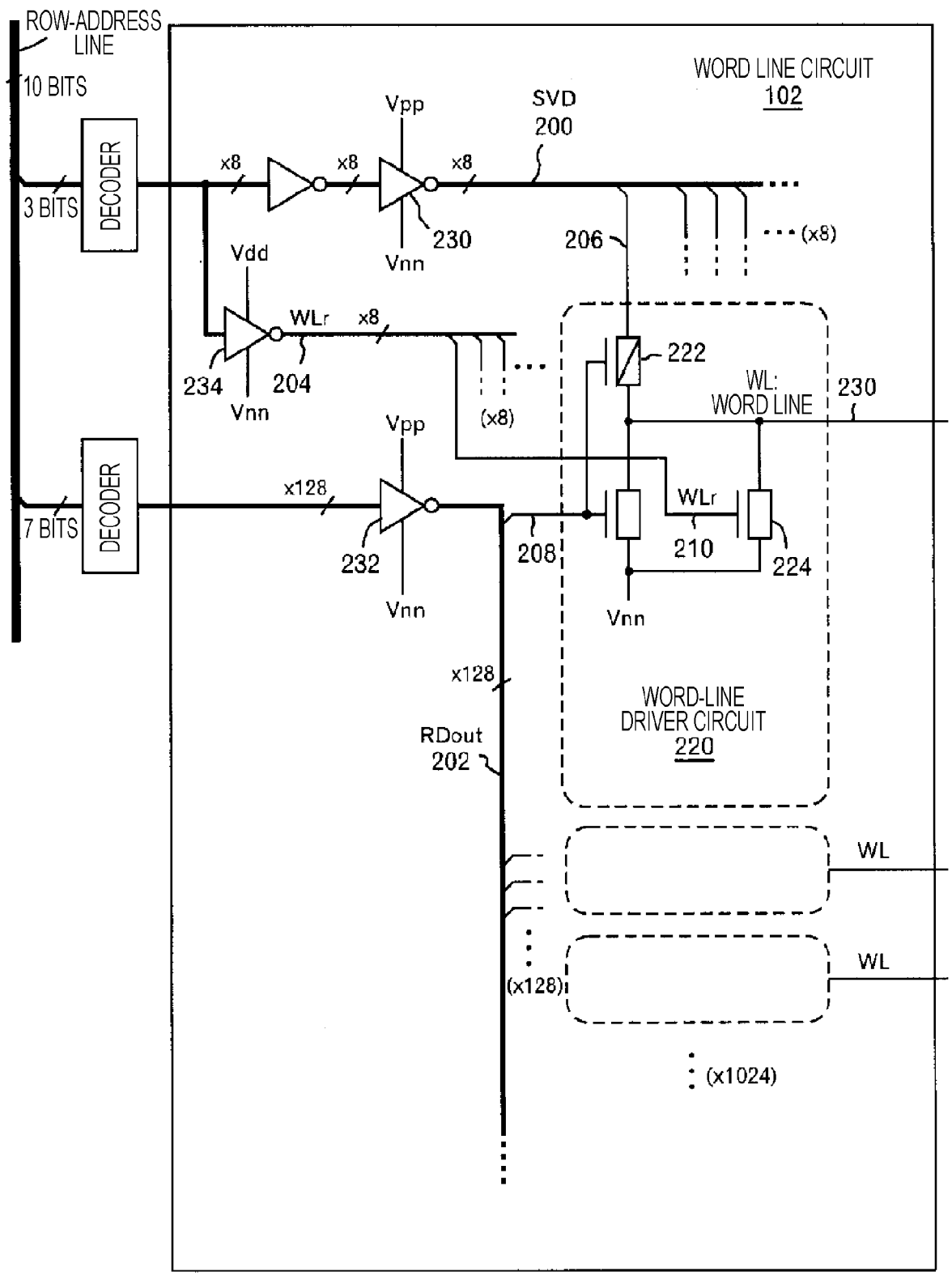
FIG. 2 shows a detailed circuit configuration of a word line circuit.

The row address decoder 100 has a word line circuit 102, for each memory cell array, which is a circuit block for generating word lines 124 to 126 and so on and for driving them to a high or low level. FIG. 2 shows a detailed example of the word line circuit 102. The example shows the word line circuit 102 in the row address decoder 100 that inputs a 10-bit row address to generate total 1,024 word lines. Specifically, the word line circuit 102 decodes 3 bits of the 10-bit row address to generate eight source drive signals (SDV) 200 and eight word-line reset signals (WLr) 204, and decodes the remaining 7 bits of the row address to generate 128 decoder output signals (RDout) 202. Thus, there are 1,024 word-line driver circuits 220 corresponding to different 1,024 (=8×128) combinations of a pair of one of the eight source drive signals (SDV) 200 and one of the eight word-line reset signals (WLr) 204 corresponding to the one source drive signal and one of the 128 decoder output signals (RDout) 202. The 1,024 word-line driver circuits 220 drive 1,024 word lines (WL) 230 and so on. In other words, one source drive signal 206 is input to all of the 128 word-line driver circuits 220 to which the 128 decoder output signals 202 are input, respectively, and one decoder output signal 208 is input to all of the eight word-line driver circuits 220 to which the eight source drive signals 200 are input, respectively.

One of the word-line driver circuits 220 will be described. When 3 bits of the 10-bit row address is decoded so that one source drive signal 206 is selected, the source drive signal 206 rises to the high level (Vpp) by the high-level supply voltage Vpp of a driver 230, and a word-line reset signal 210 falls to the low level (Vnn) by the low-level supply voltage Vnn of a driver 234. At that time, when the remaining 7 bits are decoded so that the decoder output signal 208 is selected, the decoder output signal 208 falls to the low level (Vnn) by the low-level supply voltage Vnn of a driver 232. Thus, the source of a P-channel MOS FET 222 in the word-line driver circuit 220 connected to the source drive signal 206 comes to the high level (Vpp), and the gate comes to the low level (Vnn). Therefore, the P-channel MOS FET 222 is turned on, and thus the voltage of the drain of the P-channel MOS FET 222 also comes to the high level (Vpp). Since the word-line reset signal 210 to the word-line driver circuit 220 is at the low level (Vnn), an N-channel MOS FET 224 is turned off. As a result, the word line 230 is driven to the high level (Vpp) to turn on the gates of the multiple cell transistors connected to the word line 230. In contrast, when the source drive signal 206 is not selected as a result of decoding the row address, the word-line reset signal 210 comes to the high level (Vdd) by the high-level supply voltage Vdd of the driver 234, so that the N-channel MOS FET 224 is turned on. As a result, the word line 230 is driven to the low level (Vnn), so that the gate of the cell transistor connected to the word line 230 remains off.

The high-level supply voltage Vpp for the drivers 230 and 232 and the low-level supply voltage Vnn for the drivers 230, 232, and 234 are supplied from a Vpp pump 130 and a Vnn pump 132 in FIG. 1, respectively. The Vpp pump 130 and the Vnn pump 132 are disposed at the outer periphery of the memory cell arrays 104 and 106. The Vpp pump 130 is connected to the Vpp supply line in the row address decoder 100 through a metal wire 140. The Vnn pump 132 is connected to the Vnn supply line in the row address decoder 100 through a metal wire 142.

The current consumed in the word line circuit 102 will be discussed. The high-level supply voltage of the word line circuit 102 is Vpp, and the low-level supply voltage is Vnn. Therefore, the current (Iw) consumed by access to the memory cells flows from the Vpp pump 130 to the Vnn pump 132, as shown in FIG. 1. Since the Vpp pump 130 and the Vnn pump 132 normally generate current from the internal power supply Vdd of the memory chip, the current Iw is also generated from the internal power supply Vdd. The current expressed as [Ex. 1] flows from the power supply Vdd to the ground, which is the total current consumed in the word line circuit 102 of the memory chip.

Iw(1/Evp+1/Evn)                     [Ex. 1]

where Evp is the efficiency of the Vpp pump 130 expressed in percentages, and Evn is the efficiency of the Vnn pump 132 expressed in percentages. Their reciprocals are multiplied by Iw and the resultant values are added together. Since Evp and Evn are generally 0.5 or less, their reciprocals become 2 or more. Accordingly, the consumed current becomes several times as high as the current Iw which is actually necessary for the word line circuit 102.

The Vpp pump 130 and the Vnn pump 132 are generally disposed around the memory chip. The word line circuit 102 that is actually driven by the voltage supplied from them is disposed in the row address decoder 100 in the center of the memory chip, which increases wiring resistance. FIG. 1 shows the wiring resistance. To ensure sufficient high level and low level voltage of actually operating word lines, the pumps 130 and 132 must supply higher voltage in consideration of a decrease due to the wiring resistance, causing excess current consumption.

To reduce the large current consumption of the related-art word line circuit 102, the invention focuses attention on the operation mode of the circuit driven by the Vpp pump 130 and the Vnn pump 132. The Vpp pump 130 and the Vnn pump 132 are generally provided only for the word line circuit 102 and not used for other circuits at all. Both pumps 130 and 132 are used for two operations, raising the voltage level of a word line corresponding to a memory cell to be accessed to the high level (Vpp) and then returning to the low level (Vnn) and, when there is no access, the voltage level of the word line is kept at the low level (Vnn). The pumps of the related art control the voltage using a feedback circuit in a manner similar to regulators. Accordingly, when a memory cell is accessed, so that current is consumed, the voltage level Vpp is decreased, and when it falls below a predetermined level, the control circuit of the pump starts charging operation using a capacitor, and repeats the operation to return the voltage level that is decreased by current consumption to the original level. When the access is completed, no current is used, so that the voltage level rises. When the voltage level rises to above a predetermined level, the control circuit stops the charging operation by the capacitor. The pumping operation of the capacitor is made with a relatively slow cycle of once per 25 to 30 ns. In this way, the voltage level Vpp is controlled to a desired average DC level with ripple that fluctuates between predetermined two levels. This is typical negative feedback control whereby results are corrected.

However, in the actual word line circuit 102, external access or refresh is delayed by at least 10 ns from an access start command is issued until the word lines are driven (that is, access is actually started). Therefore, the timing at which large current is required for supplying the voltage level Vpp can be known well in advance. The timing when large current is needed to supply the low voltage Vnn can also be known well in advance, because it is when the access ends and the voltage level of the word lines return to the low voltage Vnn. Accordingly, for supplying voltage Vpp and Vnn, not using the operation of correcting results as in the related art, that is to say, driving a pump for the result that voltage level is decreased because current flows to return the voltage, and stopping the pump for another result that the voltage level rose because the current flow stops, but using the operation of supplying necessary current at the timing, because current flow timing is known in advance. This method does not cause a decrease in voltage level and does not cause an increase in voltage level thereafter.

An embodiment of the invention proposes a circuit configuration based on the above principle. Specifically, an embodiment of the invention is provided with the Vpp pump 130 and the Vnn pump 132 according to the related art because they are necessary to hold the voltage level of the word line 230 at Vnn when the memory cell is not accessed, and is further provided with an additional circuit for supplying a necessary amount of current locally and efficiently at necessary timing when the memory cell is accessed. Accordingly, the control circuit of the pumps does not detect fluctuations of voltage, and as a result, the low-efficient pumps are hardly operated, which remarkably reduces the operation current of the word line circuit 102 when access is made.

The above-described circuit for supplying necessary current at necessary timing when access is made is referred to as a local booster circuit, because it supplies the current by generating the high voltage (Vpp) and the negative voltage (Vnn) from the internal voltage of memory chips, so that it employs a boost system using a capacitor.

Figure 3:
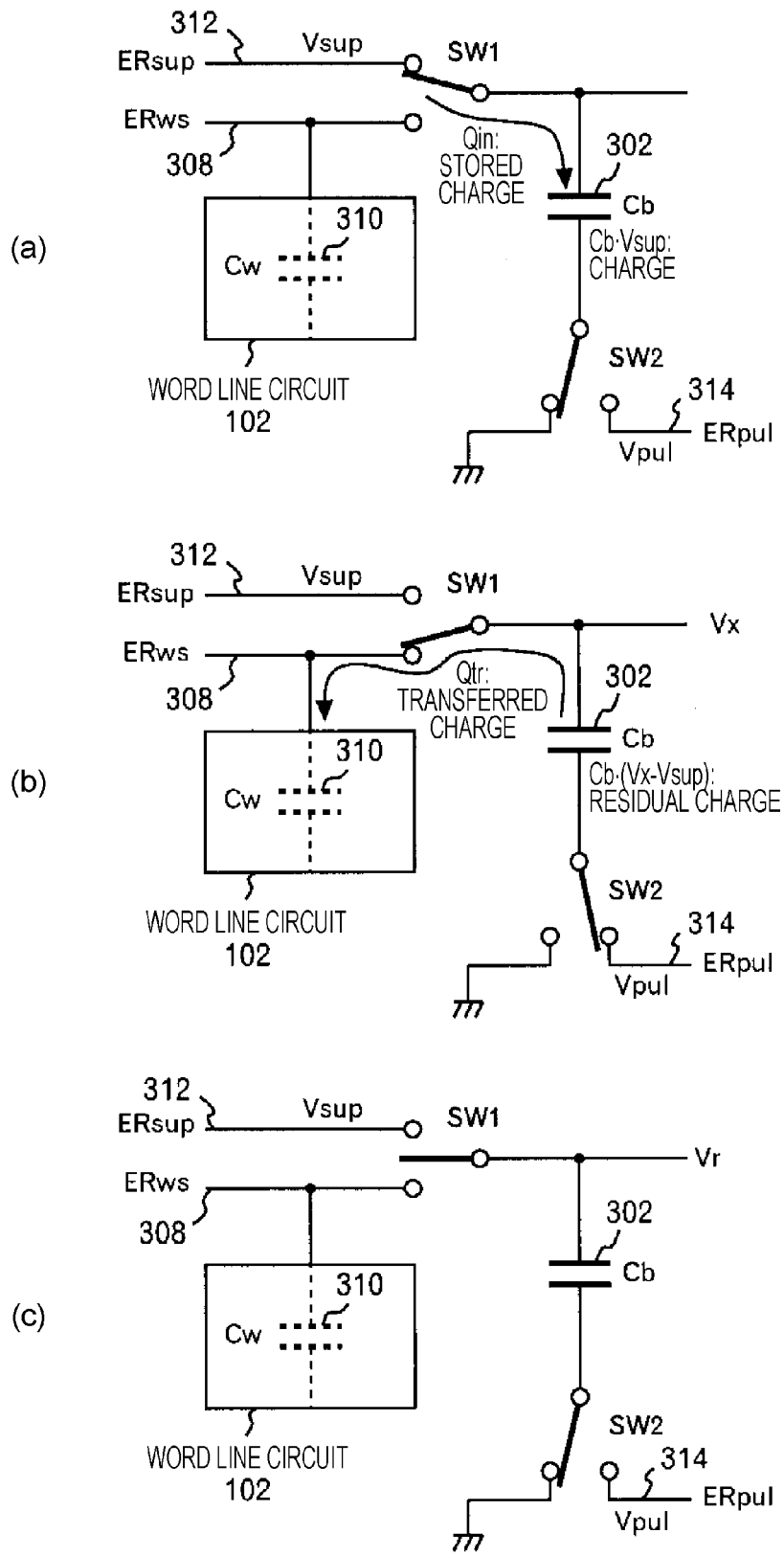
FIG. 3 shows the principle of charge transfer by a local booster circuit.

First, the principle of the local booster circuit will be described. First of all, the principle of charge transfer when a high-level voltage is supplied to word lines will be described. FIG. 3 shows the principle of charge transfer by the local booster circuit. This circuit includes a boost capacitor 302 (capacitance: Cb) and switches SW1 and SW2 that connects their electrodes to various voltage levels. The high-supply-voltage-side electrode of the word line circuit 102 that uses the voltage generated by the boost capacitor 302 is ERws 308. The word line circuit 102 has a parasitic capacitor 310 (capacitance: Cw) due to the current flowing through the electrode ERws. The parasitic capacitor 310 may include, in addition to the capacitance of the word line connected thereto, the capacitances of various lines and the junction capacitances of nodes. ERsup 312 is an electrode (supply voltage level: Vsup) for charging the boost capacitor 302, which is normally the internal voltage (Vdd) of the chip. ERpul 314 is an electrode (supply voltage level: Vpul) for raising the low-potential-side electrode of the boost capacitor 302. First, as shown in FIG. 3(a), the switch SW1 is connected to the electrode ERsup 312, and the switch SW2 is connected to the ground to charge the boost capacitor 302. The voltage level of the electrode ERws 308 of the word line circuit 102 is low, or 0 V for the purpose of brevity. Accordingly, the boost capacitor 302 accumulates electric charge Cb·Vsup, while the parasitic capacitor 310 has no electric charge.

Then, as shown in FIG. 3(b), the switch SW1 is connected to the electrode ERws 308 and the switch SW2 is connected to the electrode ERpul, so that the charge accumulated in the boost capacitor 302 is transferred to the parasitic capacitor 310 by charge sharing. Accordingly, the original charge Cb·Vsup is split into charge Cb(Vx−Vpul) accumulated in the boost capacitor 302 and charge Cw·Vx accumulated in the parasitic capacitor 310, where Vx is the voltage level of the electrode ERws 308 that has become the common node of the boost capacitor 302 and the parasitic capacitor 310. The voltage Vx is generated in the electrode ERws 308, which actually becomes the high-level voltage Vpp of the word line in the word line circuit 102. If Cb/Cw=K, the voltage Vx is expressed as $$Vx=K(Vsup+Vpul)/(K+1)$$ [Ex. 2]

Since the charge Qtr transferred to the parasitic capacitor 310 is Cw·Vx, it is expressed as $$Qtr=Cw\cdot K(Vsup+Vpul)/(K+1)$$ [Ex. 3]

Then, as shown in FIG. 3(c), the switch SW1 is opened and the switch SW2 is connected to the ground so as to reset the circuit, so that preparations for charging the boost capacitor 302 for the next access are made. At that time, the voltage level of the low-potential-side electrode of the boost capacitor 302 falls from Vpul to 0 V. Accordingly, the voltage level Vr of the high-potential-side electrode is expressed as $$Vr=(Vx-Vpul)=(K\cdot Vsup-Vpul)/(K+1)$$ [Ex. 4]

The next charging to the boost capacitor 302 is made by connecting the switch SW1 to the electrode ERsup 312 again. Accordingly, electric charge Qin given from the electrode ERsup 312 is expressed as $$Qin=Cb(Vsup-Vr)=Cb(Vsup+Vpul)/(K+1)$$ [Ex. 5]

While the first charging shown in FIG. 3(a) is made when no voltage is applied to both ends of the boost capacitor 302, the second and later charging are made from a state in which the voltage level Vr remains, which is actually necessary electric charge for every charging. Here, Qin is equal to Qtr, because K=Cb/Cw. In other words, all the electric charge Qin that is given every charging becomes electric charge Qtr to be transferred to the parasitic capacitor 310.

The charge transfer efficiency of the local booster circuit will next be discussed. The electric charge transferred is Qtr, while electric charge that is necessary for the boosting operation by the boost capacitor 302 includes the electric charge Qin (equal to Qtr) to be given to the boost capacitor 302 and electric charge by circuit operation, whose main electric charge is one which raises the voltage level of the low-potential-side electrode of the boost capacitor 302 to Vpul. This is charging current for the capacitor between the low-potential-side electrode of the boost capacitor 302 and the ground. The capacitance is lower than Cb but proportional to Cb. Therefore, the electric charge to be given is expressed as Rc·Cb·Vpul, where Rc is a proportionality constant smaller than 1. This indicates that most of the current consumed in the local booster circuit is, except the charging current to the boost capacitor 302, for raising the voltage level of the low-potential-side electrode of the boost capacitor 302 to Vpul. Therefore, the approximate transfer efficiency Qef of the local booster circuit is expressed as:

$$Qef=Qtr/(Qin+Rc\cdot Cb\cdot Vpul)$$ [Ex. 6]

This expression can be arranged using Qin=Qtr as follows:

$$Qef=1/(1+Rc(K+1)\cdot Vpul/(Vsup+Vpul))$$ [Ex. 7]

The optimum circuit system will now be obtained from those expressions. First, the higher the values Vsup and Vpul, the better the values Vx and Qef are. However, since Vsup is used for applying large current to the boost capacitor 302, the internal voltage of the chip (for example, 1.65 V) may be simply used. Table 1 shows, when 2.8V-boost voltage Vx is obtained from the internal voltage Vsup=1.65, the values of K (=Cb/Cw) corresponding to different values of Vpul, which are calculated from $$Vx=K(Vsup+Vpul)/(K+1)=2.8$$ [Ex. 8]

and the values of Qef corresponding to the values of K and Vpul are calculated from Ex. 7, where Rc assumes 0.3. That is to say, the capacitance between the low-potential-side electrode of the boost capacitor 302 and the ground assumes 30% of Cb.

TABLE 1

| Vpul (V) | K | Qef |
|---|---|---|
| 1.65 | 5.6 | 0.50 |
| 1.80 | 4.3 | 0.56 |
| 2.00 | 3.3 | 0.59 |
| 2.20 | 2.7 | 0.61 |
| 2.40 | 2.2 | 0.64 |
| 2.60 | 1.9 | 0.65 |
| 2.80 | 1.7 | 0.66 |

Table 1 shows that the value K can be small and the higher approximate charge transfer efficiency becomes higher, as the voltage Vpul for raising the low-potential-side electrode of the boost capacitor 302 increases. That is to say, although an increase in Vpul may apparently increase the electric charge for raising the voltage level of the low-potential-side electrode of the boost capacitor 302 and decrease Qef, it actually offers the advantage of decreasing the value of K, thus decreasing the capacitance Cb. Thus, the value Qef increases as the voltage Vpul increases. This shows that, for efficient operation of the local booster circuit with small current, it is better to increase the voltage Vpul as much as possible. If the voltage Vpul is set at the same value 2.8 V as Vpp, the value of K becomes 1.7, so that Cb can be increased by about 70% of Cw. In contrast, if Vpul is about 1.6 V which is the internal voltage of the memory chip, the value of Cb must be 5.6 times as high as Cw. That is, considering that Qtr is always at a constant value Cw·Vx=2.8Cw, the higher the voltage Vpul, the smaller the value of Cb may be to transfer electric charge of the same value.

Figure 4:
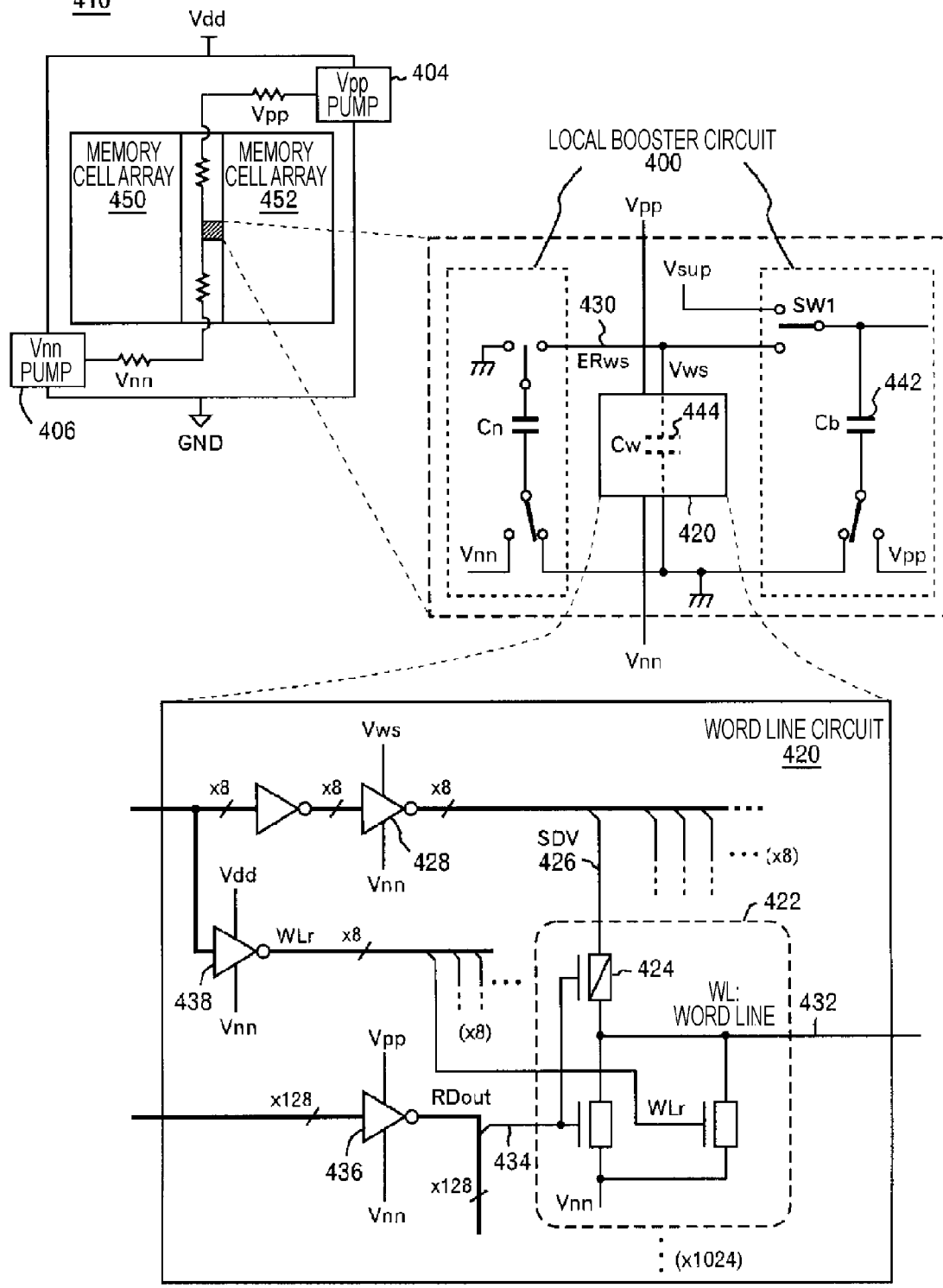
FIG. 4 shows the configuration of a memory system including a word line circuit having local booster circuits, a Vpp pump, and a Vim pump according to an embodiment of the invention.

A structure according to an embodiment of the invention will be described according to the above analysis. FIG. 4 shows the configuration of a memory system 410 according to an embodiment of the invention including a word line circuit 420 having a local booster circuit 400, a Vpp pump 404, and a Vnn pump 406. The word line circuit 420 has a driver 428 for driving a source drive signal (SDV) 426 for supplying voltage to the source of a P-channel MOS FET 424 in a word-line driver circuit 422. The driver 428 is connected to a high-supply-voltage supply line (electrode) ERws 430 (voltage level: Vws), to which the local booster circuit 400 is connected, with the switch SW1 in between. When a word line 432 is off, the voltage level Vws of the electrode ERws 430 is low. A total capacitance (corresponding to the parasitic capacitance in the above description) including the capacitances of the word lines in the word line circuit 420 from the electrode ERws 430 to the ground is referred to as Cw. The supply voltage Vpp is applied to the same component as in the known art shown in FIG. 2. That is, the high-level supply voltage Vpp to a driver 436 for driving a decoder output signal RDout 434 of the row address decoder is supplied from the Vpp pump 404. The low-level supply voltage Vnn to the drivers 428, 436, and 438 is supplied from the Vnn pump 406.

The reason why the high-level supply voltage Vpp to the driver 436 may be supplied from the Vpp pump 404 is that, although the high-level supply line of the driver 436 drives great many decoder output signals (in the embodiment, 128 signals), only one output (for example, RDout 434) is brought from high to low in actual operation, and moreover, the output drives only the gates of the FETs (for example, the P-channel MOS FETs 424) in the small number of (in the embodiment, eight) word line driver circuit 422 connected thereto, so that even if the high-level supply voltage Vpp of the driver 436 is supplied from the Vpp pump 404, little current flows from the Vpp pump 404.

On the other hand, the source drive signal SDV is used to drive the word lines connected thereto from low to high. Since the word lines consume a large amount of current because they are connected to the gates of the cell transistors of great many memory cells in a memory cell array 452, the high-level supply voltage of the driver 428 for driving the source drive signal is supplied not from the low-efficient Vpp pump 404 but from the optimized-efficiency local booster circuit 400. To optimize the local booster circuit 400, the voltage (Vpul in FIG. 3) to be supplied to the electrode for raising the voltage level of the low-potential-side electrode of the boost capacitor 442 (capacitance: Cb) is set to Vpp in this embodiment, because the higher, the better.

As described above, the embodiment of the invention employs the method of supplying the voltage Vpp generated from the Vpp pump 404, as in the related art, but using such low-efficiency pump 404 as little as possible and supplying most current using the local booster circuit 400.

To raise the low-potential-side electrode of the boost capacitor 442 to Vpp, the current from the Vpp pump 404 is generally used. However, to further reduce the current from the Vpp pump 404, there is a method of raising the voltage level from 0 V using the source follower (grounded drain type) circuit of an N-channel MOS FET, and after the voltage level has risen, switching to the voltage Vpp from the Vpp pump 404. This is because the capacitance between the low-potential-side electrode of the boost capacitor 442 and the ground is originally small since it is parallel capacitance of the capacitance of the diffusion layer of the N-channel MOS FET in which the source and drain are short-circuited and the capacitance of the depletion layer that is reverse-biased between it and a P-type substrate in the inverted N-type channel, and decreases more with increasing voltage.

For the switch SW1 in FIG. 4, a source follower (grounded drain type) composed of only N-channel MOS FETs is generally used. However, since the switch SW1 of the N-channel MOS FET type does not work well unless the gate voltage is extremely high, a voltage three times as high as Vdd must actually be applied to the gates. The embodiment of the invention is advantageous because it can use, in place of the switch formed of only the N-channel MOS FETs, a P-type channel MOS FET in which the N-type substrate is held at the voltage from the Vpp pump 404 to permit low current because of charge transfer with low resistance, and is advantageous in view of reliability because the gates do not require a high voltage.

As shown in FIG. 4, since the local booster circuit 400 is provided for each of the memory cell arrays 450 and 452 to be activated, and the portion that needs current, in other words, which local booster circuit 400 should be activated, can be known by decoding the row address given to the memory chip, the local booster circuit 400 can be ready for the above-described boosting operation. Moreover, since most of necessary current can be applied to necessary portions at necessary timing using the local booster circuit 400, the wiring resistance from the Vpp pump 404 and the Vnn pump 406 to the respective word line circuits 420 to be actually operated is insignificant, if present.

In actual design, the value Cb of the boost capacitor 442 is determined from the total capacitance Cw including the capacitances of the word lines in an estimated word line circuit 420 so that necessary voltage Vpp can be obtained as the high-level voltage for the word lines. However, some current is used from the Vpp, as described above, the values of Cb and other values are optimized so as to compensate the current. This prevents a decrease in the voltage level sensed by the control circuit of the Vpp pump 404, almost without the need for operating the Vpp pump. As a result, the current consumption of the word line circuit 420 can be remarkably reduced. In the example of the word line circuit 420 including 1,024 word lines shown in FIG. 4, 128 word-line driver circuits are connected to one source drive signal 426. Here, the capacity of the word line circuit 420 per one source drive signal 426 is about 2 pF for 128 word lines. Therefore, assuming that the voltage Vpul is set to 2.8-V Vpp, the value Cb becomes 1.7 times as high as Cw from Table 1, which may be twice for allowance, so that the value Cb can be as low as 4 pF. Thus, necessary voltage and current can be supplied with low current and small area.

Figure 5:
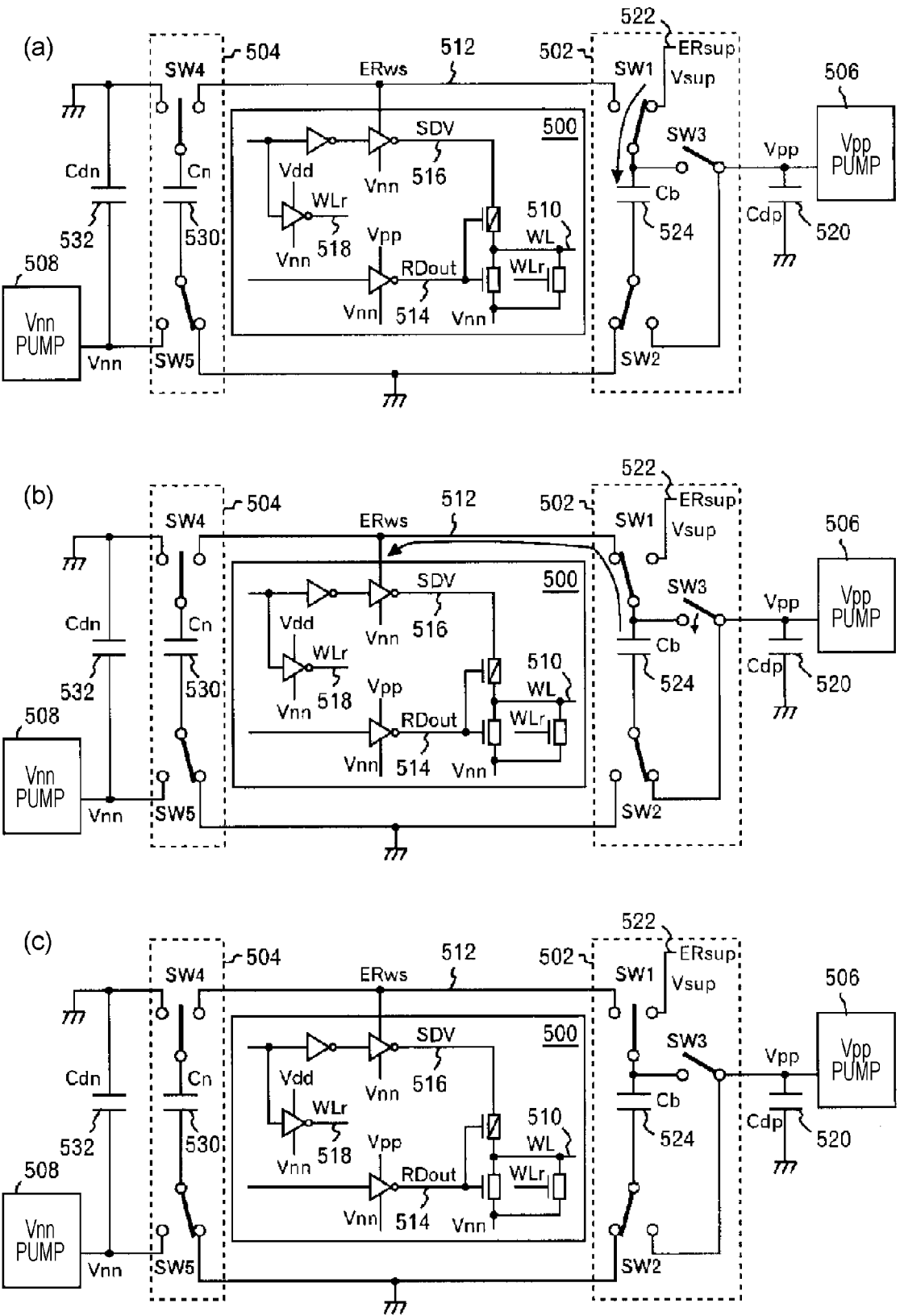
FIG. 5 shows the operating steps of a Vpp local booster circuit for a word line circuit according to an embodiment of the invention.
Figure 6:
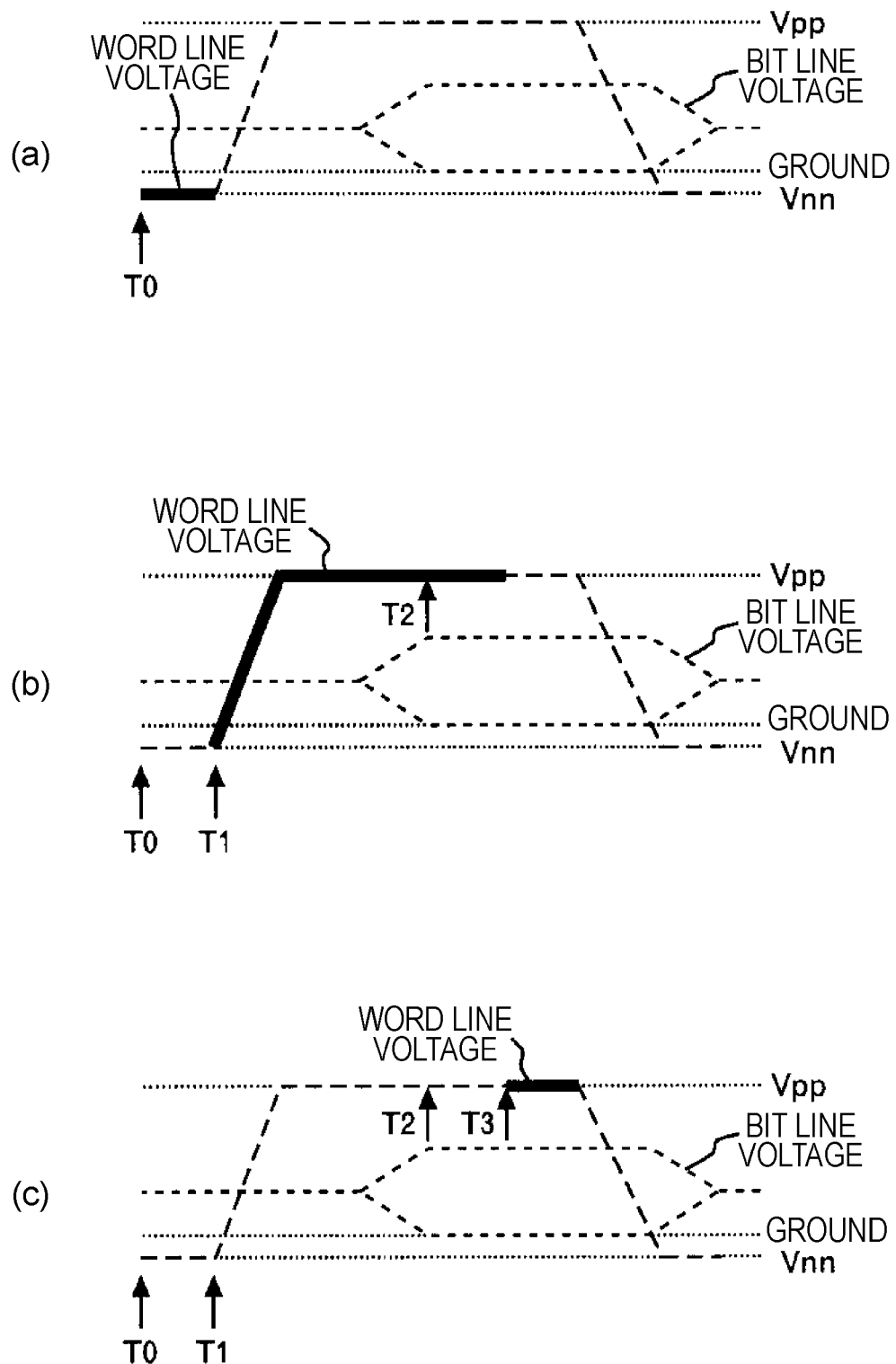
FIG. 6 is a timing chart showing changes in the voltage level of a word line in corresponding with FIG. 5.

Detailed operating steps of the structure according to an embodiment of the invention will now be described. First, the operation for bringing the voltage level of a word line to Vpp will be described. FIGS. 5($a$) to ($c$) show the operating steps of a Vpp local booster circuit 502 for a word line circuit 500 according to an embodiment of the invention. FIG. 6($a$) to ($c$) are timing charts showing changes in the voltage level of a word line 510 corresponding to FIGS. 5($a$) to ($c$), respectively.

In response to an access start request for the memory system (actually, the memory cell array of the memory system), for example, in response to the start of row address decoding by a row address decoder (not shown), with a switch SW3 opened, a switch SW1 is connected to an electrode ERsup 522, and a switch SW2 is connected to the ground, as shown in FIG. 5(a), at a predetermined timing (at time T0 in FIG. 6(a)) to charge a Vpp boost capacitor 524 (capacitance: Cb). This is for making ready for starting boosting by the Vpp boost capacitor 524 in accordance with the selection of the word line (WL) 510 by the row address decoder. The voltage level of an electrode ERws 512 is Vnn, so that the word line is also at a low level Vnn. A signal RDout 514 is biased directly by the voltage Vpp generated by the Vpp pump 506. There is a decoupling capacitor 520 (capacitance: Cdp) between the connection between the Vpp pump 506 and the Vpp local booster circuit 502 and the ground, which has an extremely large capacitance of the order of nF.

After completion of the charging to the Vpp boost capacitor 524, the row address decoding is established by the row address decoder in response to the access start request, and a memory cell array to which the word line circuit 500 belongs is designated. In response to the start of actual access to a specific memory cell, the switch SW1 is connected to the electrode ERws 512 at a predetermined timing (at time T1 in FIG. 6(b)), as shown in FIG. 5(b), and then the switch SW2 is connected to the output of the Vpp pump 506 to thereby bring the voltage level to Vpp. Thus, the Vpp boost capacitor 524 discharges electricity to the electrode ERws 512, so that the voltage of the electrode ERws 512 rises to a voltage level (slightly higher than Vpp) determined from the total capacitance Cw including the capacitances of the word lines in the word line circuit 500 and Cb, so that the word line 510, if selected by the row address decoder, can be raised to the same level as the voltage level, thus allowing the operation of reading data from the memory cell connecting to the word line 510.

After the discharging from the Vpp boost capacitor 524, the switch SW3 is closed and connected to the output of the Vpp pump 506 at a predetermined timing (at time T2 in FIG. 6(b)) during the access to the memory cell. This is to make up for the electric charge lost from the Vpp pump 506 by the voltage that is set slightly higher in the Vpp local booster circuit 502 and, when the word line 510 should be kept at a high level as in a page mode, to prevent the voltage level from falling because of current leakage. The amount of leakage current is generally small; therefore, if it is present, electric charge is supplied from the decoupling capacitor 520 with large capacitance Cdp, thus preventing a sharp drop in Vpp and a pump-up operation from starting.

Then, as shown in FIG. 5(c), the switch SW3 is opened at a predetermined timing (at time T3 in FIG. 6(c)) before an access end request is given to the memory system, and then the switch SW1 is opened and the switch SW2 is grounded so that the low-potential-side electrode of the Vpp boost capacitor 524 is grounded. Thus, the voltage at both electrodes of the Vpp boost capacitor 524 is initialized (reset) for the next charging to the Vpp boost capacitor 524. Since the electrode ERws 512 is not connected to any part and the word line 510 is kept at a high level, the electrode ERws 512 is kept charged at Vpp. A Vnn local booster circuit 504 does not operate at the timing of FIGS. 6(a) to (c).

Figure 7:
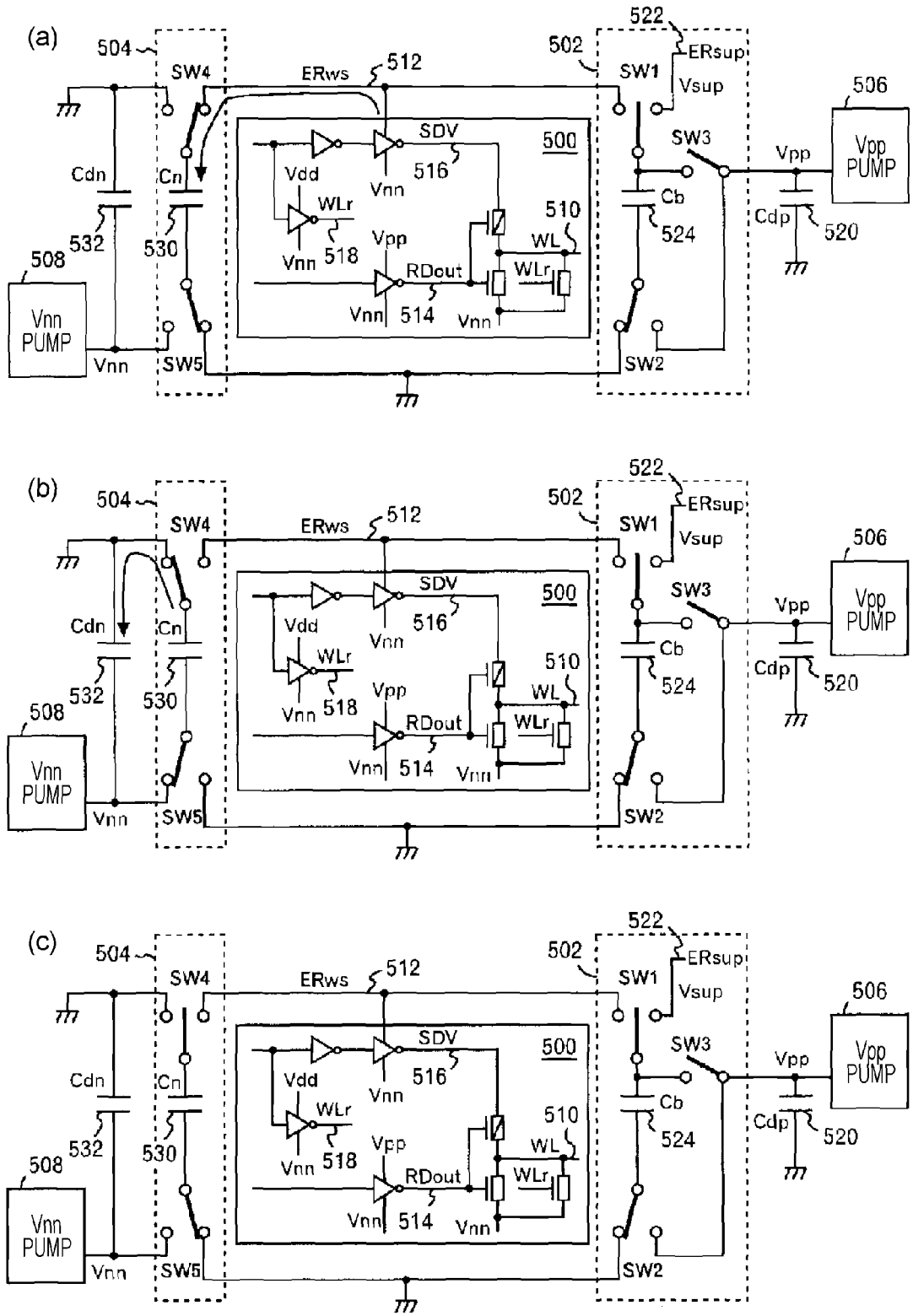
FIG. 7 shows the operating steps of a Vnn local booster circuit for the word line circuit according to the embodiment of the invention.
Figure 8:
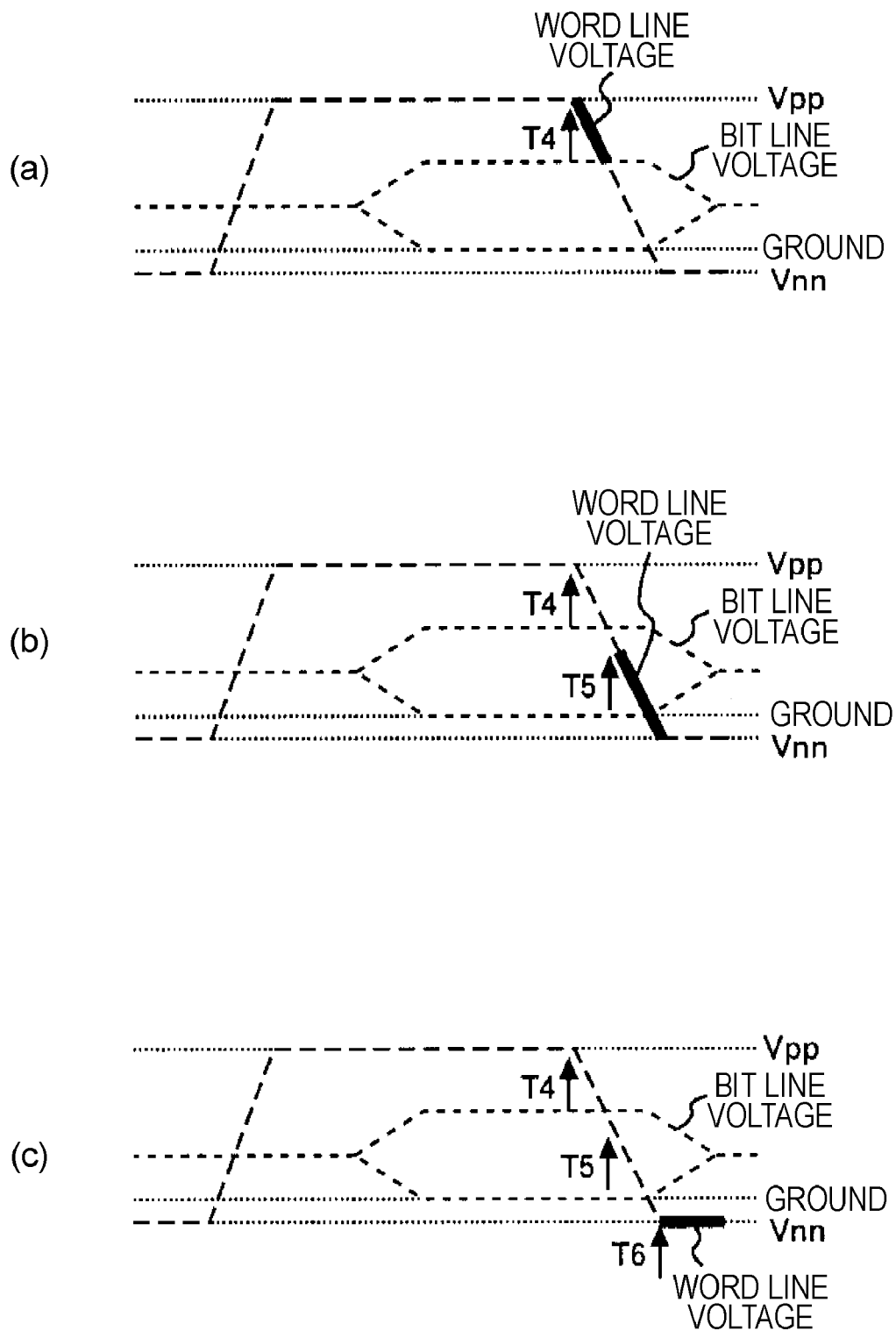
FIG. 8 is a timing chart showing changes in the voltage level of the word line in correspondence with FIG. 7.

The operation for returning the voltage level of a word line to Vnn with the structure according to the embodiment of the invention will be described. FIGS. 7(a) to (c) show the operating steps of the Vnn local booster circuit 504 for the word line circuit 500 according to the embodiment of the invention. FIG. 8(a) to (c) are timing charts showing changes in the voltage level of the word line 510 corresponding to FIGS. 7(a) to (c), respectively.

In response to an access end request for the memory system, for example, in response to the end of row address decoding by the row address decoder, a switch SW4 is connected to the electrode ERws 512, and a switch SW5 is connected to the ground, as shown in FIG. 7(a), at a predetermined timing (at time T4 in FIG. 8(a)). Thus, the electric charge stored in the total capacitance Cw including the capacitances of the word lines in the word line circuit 500 is charged in a Vnn boost capacitor 530 (capacitance: Cn). There is also a decoupling capacitor 532 (capacitance: Cdn) between the ground and the output of a Vnn pump 508, which also has an extremely large capacitance of the order of nF. The voltage level of the electrode ERws 512 begins to decrease from Vpp by the charge sharing between Cw and Cn generated by the charging from the electrode ERws 512 to the Vnn boost capacitor 530, and almost at the same time, the voltage level of the word line 510 begins to decrease, as shown in the timing chart of FIG. 8(a), as the word line 510 is not selected in response to the access end request.

After completion of the charging to the Vnn boost capacitor 530, the switch W4 is grounded and the switch S5 is connected to the output of the Vnn pump 508, as shown in FIG. 7(b), at a predetermined timing (at time T5 in FIG. 8(b)) before the voltage of the non-selected word line 510 falls to a low level and the actual access ends, to thereby bring the voltage level of the low-potential-side electrode of the Vnn boost capacitor 530 to Vnn. Thus, the electric charge accumulated in the Vnn boost capacitor 530 is supplied to the Vnn pump 508. At this timing, signals RDout 514 and WLr 518 rise to high level, and the voltage of the word line 510 is dropped to Vnn. The electric charge necessary for the dropping operation is not the charging current from the power supply but is supplied by the boosting of the Vnn boost capacitor 530, and moreover, the electric charge stored in the Vnn boost capacitor 530 is the reuse of the electric charge accumulated in the electrode ERws 512, which allows high-efficiency operation.

In response to the end of the actual access as the voltage of the non-selected word line falls to a low level (Vnn), the switch SW4 is opened and the switch SW5 is grounded, as shown in FIG. 7(c), at a predetermined timing (at time T6 in FIG. 8(c)) so that the voltage of the low-potential-side electrode of the Vnn boost capacitor 530 is grounded. Thus, the voltage of both electrodes of the Vnn boost capacitor 530 is initialized (reset) to charge the Vnn boost capacitor 530 again.

All the operating steps are thus completed, and when the next access start request for the memory system is given, for example, when decoding is started by the input of a row address to the row address decoder, the operation starting from the step of FIG. 5(a) is repeated again. In this way, the Vnn local booster circuit 504 supplies electric charge at necessary timing by reusing the electric charge generated in the Vpp local booster circuit 502, so that high efficiency is achieved. Moreover, most of the current for driving to Vpp and Vnn is not supplied from the Vpp pump 506 and the Vnn pump 508 but from the Vpp local booster circuit 502 and the Vnn local booster circuit 504, so that remarkable reduction of current consumption by the word line circuit 500 can be achieved.

Although the invention has been described using the embodiments, it is needless to say that the technical scope of the invention is not limited to the scope of the embodiments of the invention. It will be obvious to those skilled in the art that various variations or modifications can be made in the embodiment. It will also be obvious from the accompanying claims that such variations or modifications can be included in the technical scope of the invention.

The invention claimed is:

1. A memory system comprising:
a memory cell array;
an access control circuit that receives either of an access start request or an access end request for the memory cell array and controls access to the memory cell array;
a high-voltage-supply booster circuit for driving the access control circuit from a low voltage for memory access to a high voltage for memory access by supplying electric charge that is stored in advance to the access control circuit in response to the access start request; the high-voltage-supply booster circuit comprising:
a high-voltage boost capacitor for discharging electric charge that is stored in advance from a first-reference-voltage supply source to the supply source of the high voltage in the access control circuit in response to the access start request;
a first semiconductor switch, when charging, connecting a first electrode of the high-voltage boost capacitor to the first-reference-voltage supply source and, when discharging, connecting the first electrode to the high-voltage supply source in the access control circuit and, at other times, opening the first electrode; and
a second semiconductor switch, when charging, connecting a second electrode of the high-voltage boost capacitor to the ground and, when discharging, connecting the second electrode to a second-reference-voltage supply source and, at other times, connecting the second electrode to the ground; and
a low-voltage-supply booster circuit for absorbing excess electric charge when the access control circuit is switched from the high voltage to the low voltage in response to the access end request.

2. The memory system according to claim 1, further comprising a high-voltage generating circuit for generating the high voltage from a supply voltage; wherein the high-voltage-supply booster circuit further comprises:
a third semiconductor switch for connecting the first electrode of the high-voltage boost capacitor to a high-voltage supply source of the high-voltage generating circuit to supply electric charge from the first electrode to the high-voltage generating circuit.

3. The memory system according to claim 2, further comprising a low-voltage generating circuit for generating the low voltage from a supply voltage; wherein the low-voltage-supply booster circuit further comprises:
a low-voltage boost capacitor for discharging electric charge that is stored in advance from the high-voltage supply source in the access control circuit through a low-voltage supply source of the low-voltage generating circuit in response to the access end request;
a fourth semiconductor switch, when charging, connecting a first electrode of the low-voltage boost capacitor to the high-voltage supply source of the access control circuit and, when discharging, connecting the first electrode to the ground and, at other times, opening the first electrode; and
a fifth semiconductor switch, when charging, connecting a second electrode of the low-voltage boost capacitor to the ground and, when discharging, connecting the second electrode to the low-voltage supply source of the low-voltage generating circuit and, at other times, connecting the second electrode to the ground.

4. The memory system according to claim 3, wherein the memory cell array is a DRAM cell array configured by N-channel MOS FETs; and
the access control circuit is a word line circuit that drives a plurality of word lines connected to the gates of cell transistors that constitute the memory cell array.

5. The memory system according to claim 3, wherein the first reference voltage includes a supply voltage;
the second reference voltage includes the high voltage; and
the second reference voltage is supplied from the high-voltage supply source of the high-voltage generating circuit.

6. The memory system according to claim 3, wherein both of the high-voltage generating circuit and the low-voltage generating circuit are charge pump circuits.

7. A method for a memory system to supply voltage to an access control circuit using a voltage-supply booster circuit so as to drive the access control circuit with a high voltage for memory access and a low voltage for memory access, the access control circuit receiving either of an access start request or an access end request for a memory cell array and controls access to the memory cell array, the method comprising:
a first charging step of charging the voltage-supply booster circuit in response to the access start request, the first charging step further comprises the steps of:
connecting a first electrode of the high-voltage boost capacitor to a first-reference-voltage supply source in response to the access start request; and
connecting a second electrode of the high-voltage boost capacitor to the ground;
a first discharging step of discharging, after completion of the charging, the stored electric charge to the access control circuit; the first discharging step comprises the steps of:
after completion of the charging, connecting the first electrode to the supply source of the high voltage of the access control circuit in response to the start of access according to the access start request; and
after the connection, connecting the second electrode to a second-reference-voltage supply source;
a first initializing step of initializing the voltage level for the next charging while holding the residual electric charge after the discharging in the voltage-supply booster circuit; the first initializing step comprises the steps of:
after the discharging, opening the first electrode at a predetermined timing before the access end request is given;
connecting the second electrode to the ground;
wherein the voltage of the second electrode is grounded so that the voltage level is initialized for the next charging, with the residual electric charge after the discharging held in the high-voltage boost capacitor;
a second charging step of charging the voltage-supply booster circuit from the access control circuit in response to the access end request;
a second discharging step of discharging, after completion of the charging, the stored electric charge; and
a second initializing step of initializing the voltage level for the next charging while holding the residual electric charge after the discharging in the voltage-supply booster circuit;
wherein the voltage-supply booster circuit includes a high-voltage boost capacitor.

8. The method according to claim 7, wherein the memory system further comprises a high-voltage generating circuit for generating the high voltage from a supply voltage and supplying it; and the method comprises the steps of:

after the first discharging step, connecting the first electrode of the high-voltage boost capacitor to a high-voltage supply source of the high-voltage generating circuit at a predetermined timing before the first initializing step to thereby supply electric charge from the first electrode to the high-voltage generating circuit; and after the supplying step, releasing the connection of the first electrode to the high-voltage supply source of the high-voltage generating circuit at a predetermined timing before the first initializing step.

9. The method according to claim 8, wherein the voltage-supply booster circuit further comprises a low-voltage boost capacitor;

the memory system further comprises a low-voltage generating circuit for generating the low voltage from a supply voltage and supplying it; and the second charging step comprises the steps of:

connecting a first electrode of the low-voltage boost capacitor to the high-voltage supply source of the access control circuit in response to the access end request; and connecting a second electrode of the low-voltage boost capacitor to the ground; and the second discharging step comprises the steps of:

after completion of the charging, connecting the first electrode to the ground at a predetermined timing before the end of access responsive to the access end request; and connecting the second electrode to a low-voltage supply source of the low-voltage generating circuit; and the second initializing step comprises the steps of:

opening the first electrode in response to the end of access; and connecting the second electrode to the ground; and wherein the voltage of the second electrode is grounded so that the voltage level is initialized for the next charging, with the residual electric charge after the discharging held in the low-voltage boost capacitor.

* * * * *